(12) United States Patent  
Cornett

(10) Patent No.: US 7,200,378 B2  
(45) Date of Patent: Apr. 3, 2007

(54) ROCKING POTENTIAL-WELL SWITCH AND MIXER

(75) Inventor: Kenneth David Cornett, Coral Springs, FL (US)

(73) Assignee: Freescale Semiconductor, Inc., Austin, TX (US)

( * ) Notice: Subject to any disclaimer, the term of this patent is extended or adjusted under 35 U.S.C. 154(b) by 1270 days.

(21) Appl. No.: 10/017,252

(22) Filed: Dec. 14, 2001

(65) Prior Publication Data

US 2003/0114131 A1    Jun. 19, 2003

(51) Int. Cl.  
*H04B 1/28* (2006.01)

(52) U.S. Cl. .................... 455/333; 327/113; 257/23

(58) Field of Classification Search ............... 455/313, 455/323, 325–326, 333; 327/113; 257/107, 257/23, 162  
See application file for complete search history.

(56) References Cited

U.S. PATENT DOCUMENTS

| 5,304,859 A | * | 4/1994 | Arimoto | 327/535 |
| 6,529,720 B1 | * | 3/2003 | Jovenin et al. | 455/318 |
| 2001/0008286 A1 | * | 7/2001 | Kinoshita | 257/133 |

\* cited by examiner

*Primary Examiner*—Nguyen T. Vo  
(74) *Attorney, Agent, or Firm*—Charles W. Bethards

(57) ABSTRACT

Channelizing an applied current and applying a voltage to the channelized current enables switching of the applied current. According to the present invention, an applied current enters through a signal input carrier (12) and is channelized by a plurality of lateral potential wells created by a plurality of polysilicon fingers gates (14). A first voltage is applied to a first set of the plurality of polysilicon finger gates (32) and a second differential voltage is applied to a second set of the plurality of polysilicon finger gates (34), which results in a differential current flow among the lateral potential wells beneath the first and second sets of polysilicon fingers (32, 34), respectively. The differential current then flows to first and second signal output carriers (40, 42).

11 Claims, 3 Drawing Sheets

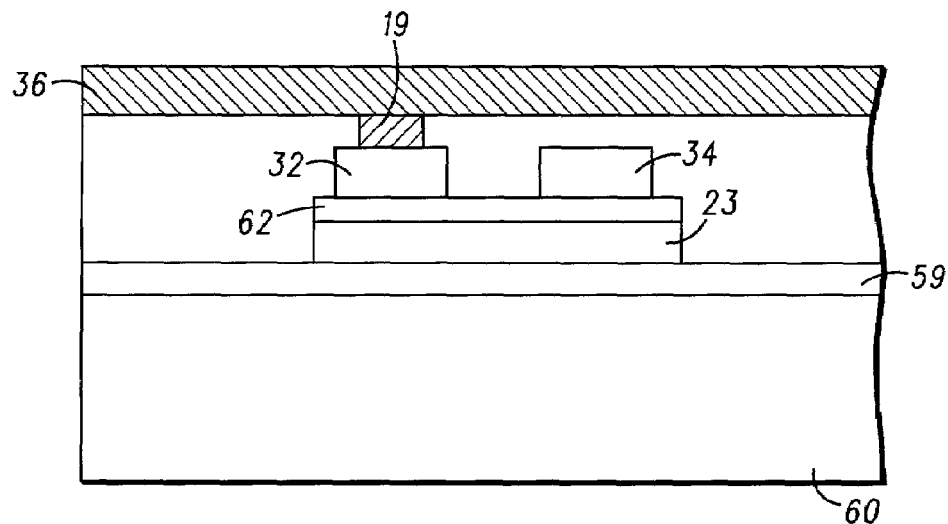
FIG. 3B
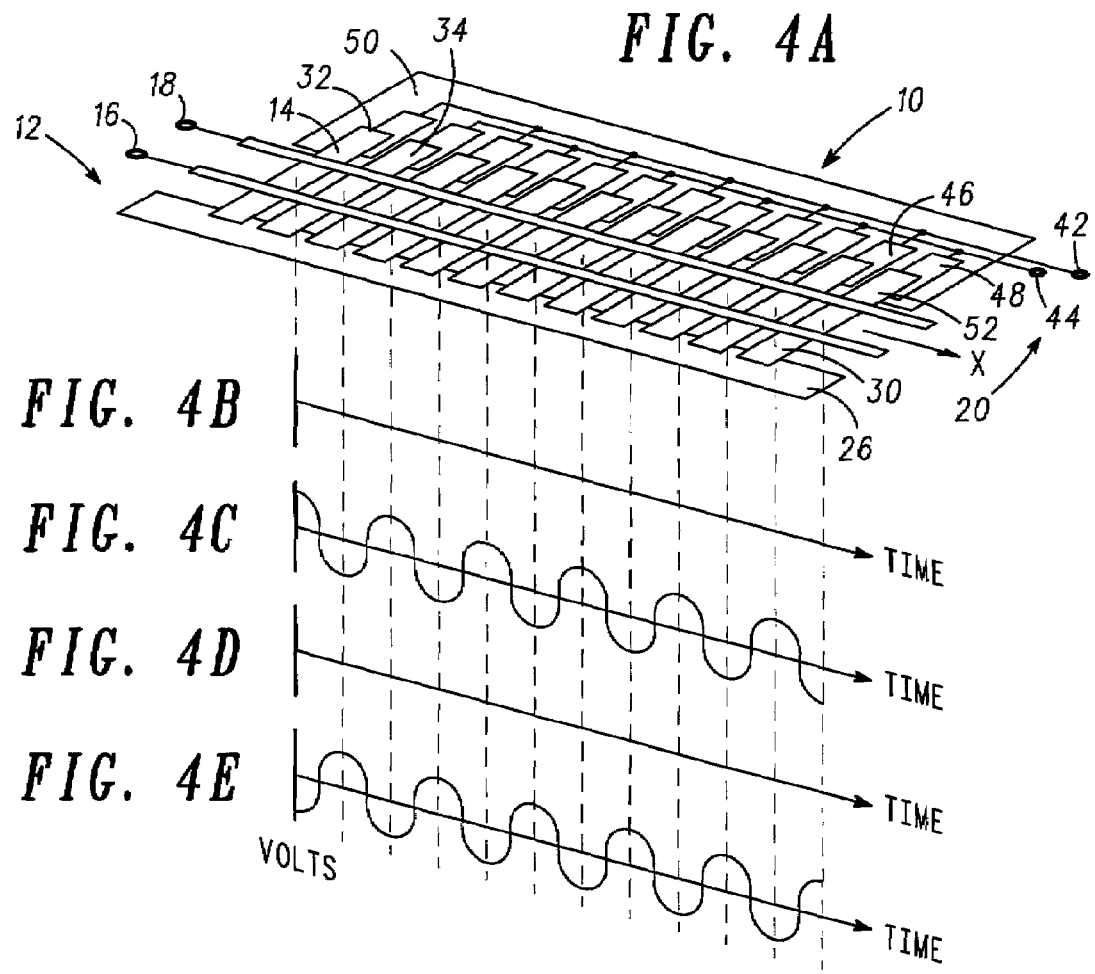

ROCKING POTENTIAL-WELL SWITCH AND MIXER

BACKGROUND OF THE INVENTION

1. Field of the Invention

The present invention relates generally to semiconductor devices, and more particularly to a semiconductor switching device.

2. Description of the Related Art

Conventional switching devices such as FET switches, diodes or Gilbert Cells are capable of providing switching capability for electrical signals. Such switching devices provide a differential output based upon a differential gate signal applied to an input current.

For example, as is well known, a Gilbert Cell single-balanced mixer includes an RF signal input carrier in electrical communication with the respective sources of first and second transistors. The gate of the first transistor is connected to a high potential voltage connection (LO+) and the gate of the second transistor is connected to a low potential voltage connection (LO−). The drain of the first transistor is in electrical communication with a high current output (IF+) and the drain of the second transistor is in electrical communication with a low current output (IF−).

In operation, a first voltage applied to LO+ and a second voltage applied to LO−, which is the complement of the first voltage, results in current flow through IF+ and little or no current flow through IF−. Reversing the voltage applied to LO+ and LO− reverses the current flow through IF+ and IF−, respectively.

A Gilbert Cell double-balanced mixer with two single-balanced mixers includes two RF signal input carriers, a high input current (RF+) and a low input current (RF−) that is the complement of RF+. A first voltage (LO+) is applied to the gates of first and fourth transistors. A second voltage (LO−) that is the complement of the first voltage is applied to the gates of the second and third transistors. The drains of the first and third transistors are in electrical communication with IF+, and the drains of the second and fourth transistors are in electrical communication with IF−.

In operation, a first high voltage applied to LO+ and a second low voltage applied to LO− results in current flow through IF+ and little or no current flow through IF−. Reversing the voltage applied to LO+ and LO− reverses the current flow through IF+ and IF−, respectively.

However, during operation of the single-balanced or double-balanced Gilbert Cell the gate of one transistor normally turns on either slightly ahead of, or behind, the instant that another gate switches off due to slight differences in either the gate characteristics or a drive circuit imbalance. This transient time in which both gates are either on or off contributes to device noise and/or nonlinearity. As the frequency of applied voltages LO+ and LO− increases, the transient time becomes a greater percentage of the voltage period.

In addition, the double-balanced Gilbert cell requires balanced inputs to optimize the distortion performance and LO to IF isolation.

BRIEF DESCRIPTION OF THE DRAWINGS

Additional objects and advantages of the present invention will be more readily apparent from the following detailed description of preferred embodiments thereof when taken together with the accompanying drawings in which:

FIG. 3B is a cross section view of the rocking potential-well of FIG. 1 taken along line III—III of the second preferred embodiment.

FIG. 4A is a front elevation view of the rocking potential-well mixer of FIG. 1 of both the first and second preferred embodiments of the present invention.

FIGS. 4B–4E are graphs of the electrical potential in the lateral potential wells at different areas within the rocking potential-well mixer of FIG. 4A during operation.

DETAILED DESCRIPTION OF THE PREFERRED EMBODIMENTS

Figure 1:
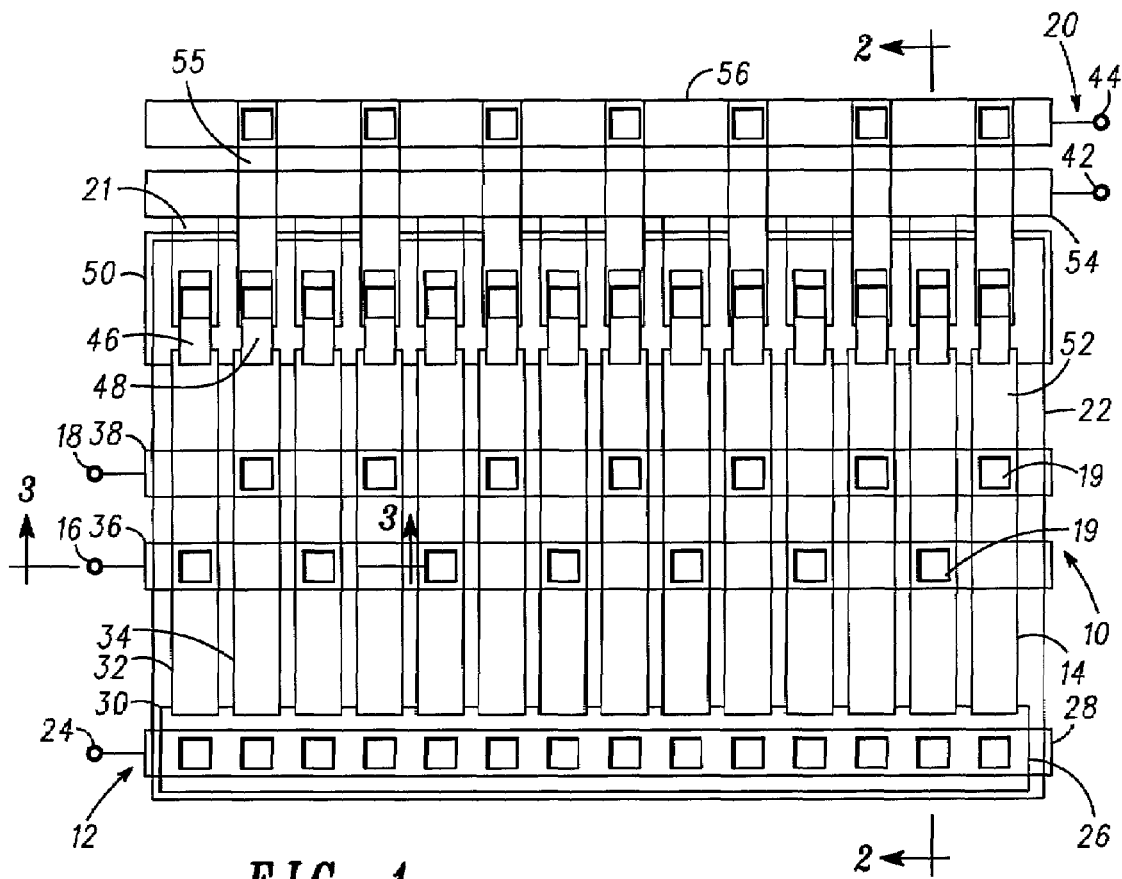
FIG. 1 is a top plan view of a rocking potential-well mixer of both first and second preferred embodiments in accordance with the present invention.

Referring now to the drawings in which like numerals reference like parts, FIG. 1 shows the rocking potential-well mixer (RPWM) 10 according to both first and second preferred embodiments of the present invention. The RPWM 10 includes a signal input carrier 12, a plurality of conductive finger gates 14 in electrical communication with first and second metal volt-finger contacts 36, 38, thus voltage terminals 16, 18 using a plurality of via contacts 19, one for each of the conductive finger gate 14 (See also FIGS. 2A–2B), and a signal output carrier 20. The signal input carrier 12, the conductive finger gates 14, and the signal output carrier 20 are at least partially disposed above a shallow N-type well region 22. In accordance with the first and second preferred embodiments of the present invention and as will be described below in detail, the conductive finger gates 14 manipulate the flow of an electrical signal, generally within the N-type well region 22, from the signal input carrier 12 to the signal output carrier 20.

The signal input carrier 12 is for inputting, in a single-sided mode, electrical signals such as, for example, radio frequency (RF) current and includes an input terminal 24 (See also FIGS. 2A–2B), a heavily doped N-type input contact 26 and a metal input contact 28. The metal input contact 28, which can be any ohmic metal such as cobalt, aluminum or copper, facilitates electrical communication between the input terminal 24 and the heavily doped N-type input contact 26 with limited resistance.

The conductive finger gates 14, which are preferably made of a conductive material such as polysilicon, electrically communicate with the signal input carrier 12 and the signal output carrier 20. Specifically, each of the conductive gates 14 can facilitate or prohibit current flow from the heavily doped N-type input contact 26 of the signal input carrier 12 through the N-type well region 22 to the heavily doped N-type output contacts 46, 48 of the signal output carrier as a result of a voltage signal application (discussed further below). The conductive finger gates 14 include first and second sets of conductive finger gates arranged in an alternating configuration. For example, odd conductive finger gates, beginning with the first conductive finger gate 32 in FIG. 1, can define the first set of conductive finger gates, and even conductive finger gates, beginning with the second conductive finger gate 34, can define the second set of conductive finger gates. Hereinafter, the first and second sets of conductive finger gates will be identified for purposes of discussion by the reference numerals 32, 34, respectively.

The first set of conductive finger gates 32 includes conductive finger gates that are in electrical communication with the first voltage terminal 16 via the metal volt-finger contact 36, while the second set of conductive finger gates 34 includes conductive finger gates that are in electrical communication with the second voltage terminal 18 via the metal volt-finger contact 38. The first and second voltage terminals 16, 18 and the first and second sets of conductive finger gates 32, 34 electrically communicate or are coupled one to the other through the via contacts 19 and the first and second metal volt-finger contacts 36, 38. The metal volt-finger contacts 36, 38 are formed in a fashion and using materials similar to the metal input contact 28. The first and second voltage terminals 16, 18 are particularly adapted for coupling in a differential mode an electrical manipulating signal, preferably a local oscillator (LO) signal to the first and second sets of finger gates 32, 34.

The signal output carrier 20 is for outputting, in a differential mode, the RF current as manipulated by a signal at finger gates 32, 34 after being channelized by the conductive finger gates 14. In a preferred form this output signal at signal output carrier 20 is an intermediate frequency (IF) signal or the product of the input RF signal at 12 and the LO signal at 36, 38. The signal output carrier 20 includes two output terminals 42, 44 electrically coupled to a plurality of heavily doped N-type output contacts 46, 48 that are deposited in an optional P-type implant 50. The output terminal 42 is, preferably, coupled to a first metal output contact 54 that includes a plurality of finger metal extensions 21 that are coupled to N-type output contacts 46. Similarly output terminal 44 is, preferably, coupled to a second metal output contact 56 that in turn is coupled to a plurality of polysilicon conductors 55 and these are coupled to the N-type output contacts 46. The plurality of heavily doped N-type output contacts 46, 48 are in electrical communication with the conductive finger gates 14. More specifically, a first set of the conductive finger gates 32 can facilitate or prohibit current flow to the first set of heavily doped N-type output contacts, such as the heavily doped N-type output contact 46 referenced in FIG. 1. A second set of the conductive finger gates 34 can facilitate or prohibit current flow to the second set of heavily doped N-type output contacts, such as the heavily doped N-type output contact 48 referenced in FIG. 1. Throughout the specification, the first and second sets of heavily doped N-type output contacts are identified for purposes of discussion by the reference numerals 46, 48, respectively.

As noted earlier the first set of heavily doped N-type output contacts 46 electrically communicates with the first metal output contact 54, using metal finger extensions 21 and via contacts 19, and the second set of heavily doped N-type output contacts 48 electrically communicates with the second metal output contact 56 using the plurality of polysilicon conductors 55 and respective via contacts 19 as depicted. If the optional P-type implant 50 is used it will be deposited and then the first and second sets of heavily doped N-type output contacts 46, 48 will be deposited in the P-type region 50 thereby enhancing isolation between the first and second sets of heavily doped N-type output contacts 46, 48. The two metal output contacts 54, 56 are located outside of the N-type well region 22, and are in electrical contact, respectively, with the output terminals 42, 44. The two metal output contacts 54, 56 and the finger extensions 21 can have a configuration and be constructed similar to the metal input contact 28.

Figure 2A:
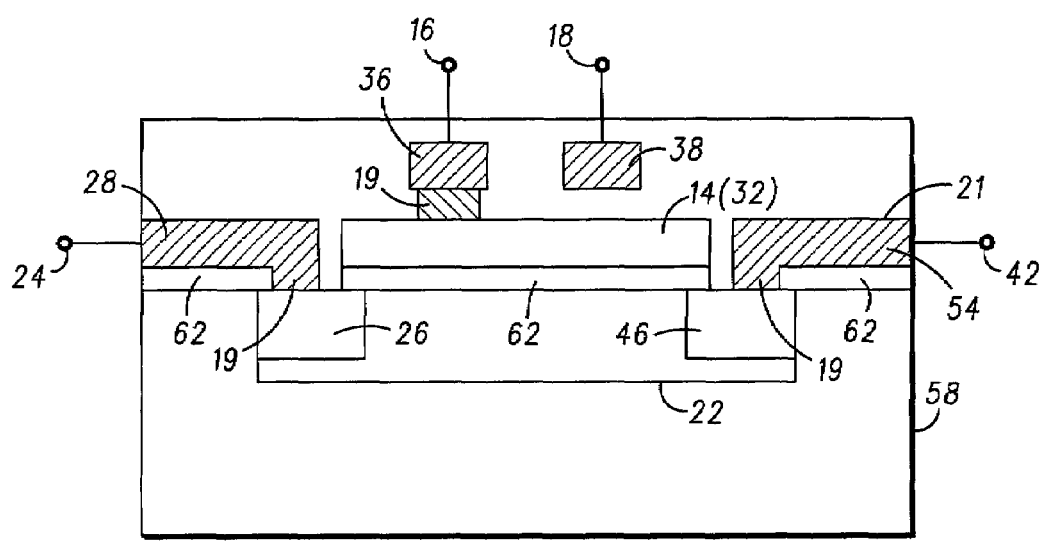
FIG. 2A is a cross sectional view of the rocking potential-well of FIG. 1 taken along line II—II of the first preferred embodiment.

Referring now specifically to FIG. 2A, a cross section of the RPWM 10 of the first preferred embodiment as seen along section lines II—II in FIG. 1 is shown. Within a lightly doped P-type layer 58 is the shallow N-type well region 22. The lightly doped P-type layer 58 could be a lightly doped P-type substrate or a P-type epitaxial layer grown above an N-type or P-type substrate, or created by well-known ion-implantation, thermo heating or dielectric deposition techniques. The N-type well region 22 may be obtained by deeply diffusing N-type silicon into the P-type layer 58. Within the N-type well region 22 are the heavily doped N-type input and output contacts 26, 46, 48 (output contact 48, second metal output contact 56, and output terminal 44 are not shown in FIG. 2A), which can be added by diffusion. The first end 30 of each of the plurality of conductive finger gates 14 is disposed above the input contact 26, and the second end 52 of each of the conductive finger gates 14 is disposed above one of the first and second sets of heavily doped N-type output contacts 46, 48. The first and second voltage terminals 16, 18 contact the first and second sets of conductive finger gates 32, 34, respectively, via the metal volt-finger contacts 36, 38 and the via contacts 19 as discussed above. The metal input contact 28 and finger metal extension 21 contacts the heavily doped input contact 26 and heavily doped output contacts 46, respectively without directly contacting the conductive finger gates 14 or the gate oxide layer 62. Between the conductive finger gates 14 and the metal input contact 28 and metal finger contact 21 can be silicon dioxide, silicon nitrate or a combination of the both.

Figure 2B:
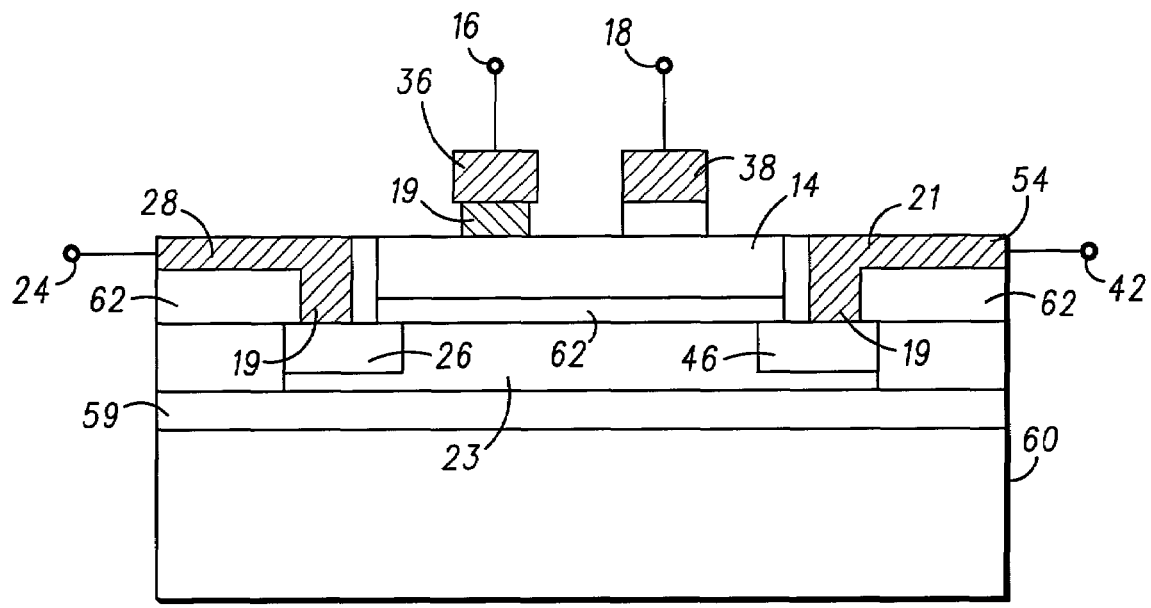
FIG. 2B is a cross sectional view of the rocking potential-well of FIG. 1 taken along line II—II of the second preferred embodiment.

Referring now to FIG. 2B, a partial cross section of the RPWM 10 as seen along section lines II—II in FIG. 1 of the second preferred embodiment is shown. A buried oxide layer 59 is disposed above a silicon wafer 60. A silicon on insulator (SOI) layer 23 is disposed above the buried oxide layer 59, and is patterned to include heavily doped N-type silicon at the edges 26, 46, 48 (heavily doped N-type output contact 48, second metal output contact 56, and output terminal 44 are not shown in FIG. 2B) and can be created by, for example, common silicon etching techniques. The other elements are similar to corresponding elements shown in the first embodiment.

Figure 3A:
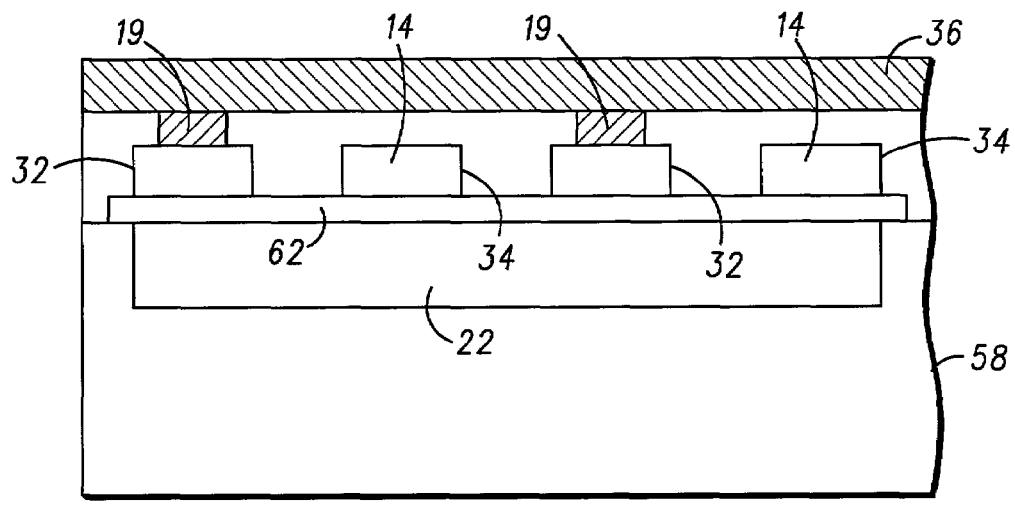
FIG. 3A is a cross section view of the rocking potential-well of FIG. 1 taken along line III—III of the first preferred embodiment.

Referring now to FIG. 3A, a partial cross section of the RPWM 10 as seen along section lines III—III in FIG. 1 of the first preferred embodiment is shown. As can be seen, the first metal volt-finger contact 36 is only in electrical communication with the first set of the conductive finger gates 32 through the via contacts 19.

Referring now to FIG. 3B, a partial cross section of the RPWM 10 as seen along section lines III—III in FIG. 1 of the second preferred embodiment is shown. In this embodiment, the first metal volt-finger contact 36 is also only in electrical communication with the first set of the conductive finger gates 32 through the via contacts 19.

Referring to FIGS. 4A–4E, operation of the RPWM 10 will be discussed in more detail. Initially, a first high voltage is applied to the first voltage terminal 16 and a second low voltage is applied to the second voltage terminal 18. The first high voltage is coupled by the first volt-finger metal contact 36 to the first set of conductive finger gates 32 through the via contacts 19. The second low voltage is coupled by the second volt-finger metal contact 38 to the second set of conductive finger gates 34 through the respective via contacts 19. Applying the high voltage to one of the sets of conductive finger gates 32, 34 and the low voltage to the other set results in a capacitive coupling of the conductive finger gates 14. The arrangement of the plurality of conductive finger gates 14 disposed in parallel above the N-type well region 22 and in electrical communication with the first and second voltage terminals 16, 18 via the metal volt-finger contacts 36, 38 results in a series of lateral potential wells within the N-type well region 22 under each of the conductive finger gates 14 The lateral potential wells are created because the gate voltages capacitively induce (or rock) the lateral potential distribution in the N-type well region 22. The first set of conductive finger gates 32 to which the high voltage is applied creates high potential lateral wells and the second set of conductive finger gates 34 to which the low voltage is applied creates low potential lateral wells and a depletion region within the N-type well region 22. The majority carriers (electrons) subsequently flow from the first heavily doped output contact 46 of the signal output carrier 20 to the heavily doped input contact 26 of the signal input carrier 12 through the high potential lateral wells due to this electrical potential gradient. The depletion region created by the low voltage within the N-type well region helps prohibit the current flow through the low potential wells. This N-type well region can be fully or partially depleted. The optional P-type implant 50 located between the N-type doped output contacts 46, 48 in the first embodiment improves the electrical isolation between the N-type doped output contacts 46, 48. The gate oxide layer 62 separates the conductive finger gates from the N-type well region 22 and isolates the current flowing into the N-type well region 22. As a result of the electrons flowing among the high potential lateral wells, the RF current flowing from the signal input carrier 12 to the signal output carrier 20 is channelized among the high potential lateral wells. More specifically, RF current entering through the signal input carrier 12 flows through the high potential wells (first set of conductive finger gates 32) to the first output terminal 42, but not through the low potential wells (second set of conductive finger gates 34) to the second output terminal 44.

Subsequently, the first and second voltages are then switched so that a low voltage is applied to the first voltage terminal 16 and a high voltage is applied to the second voltage terminal 18. This switching results in RF current flowing through the high potential wells (second set of conductive finger gates in this case 34) to the second output terminal 44, but not through the low potential wells (first set of conductive finger gates 32) to the first output terminal 42.

A switching transient period can occur during the switching of the two voltages in which the two voltages will either both be on or off. During this switching transient period, the potential under the plurality of conductive finger gates 14 in the RPWM 10 will be equal. Therefore, the electrons flowing from the signal output carrier 20 to the signal input carrier 12 will flow equally among the first and second sets of lateral potential wells, thereby resulting in the RF current also flowing equally among the lateral potential wells and a zero differential current output. Because the current flowing to the two output terminals 42, 44 is equal, no noise is created during the switching transient period.

The potential in the RPWM 10 at four different time points is illustrated in FIGS. 4B–4E. Initially, at t=0 as shown in FIG. 4B, no voltage is applied to either voltage terminal 16, 18, and the potential in each lateral potential well is equal. At t=$\tau$/4 shown in FIG. 4C, a high voltage is applied to the first voltage terminal 16 and a low voltage is applied to the second voltage terminal 18. At this instant the potential in the first set of lateral potential wells is high and the potential in the second set of lateral potential wells is low. At t=$\tau$/2 shown in FIG. 4D, either a high voltage is applied to both voltage terminals 16, 18 or a low voltage is applied to both terminals 16, 18. At this instant the potential in all of the lateral potential wells is equal as at t=0. At t=3$\tau$/4 shown in FIG. 4E a low voltage is applied to the first terminal 16 and a high voltage is applied to the second terminal 18. At this instant, the potential in the first set of lateral potential wells is low and the potential in the second set of lateral potential wells is high. The resulting potential levels in the two sets of lateral potential wells are shifted 180° in phase from each other at t=$\tau$/4 and t=3$\tau$/4.

In an optional modification, a double balanced RPWM for manipulating a differential RF signal can be created by connecting two RPWMS by their respective voltage terminals 16, 18. Such a configuration could be used to add or subtract RF carrier frequency.

In view of the above discussion, it should be appreciated that the RPWM 10 according to the preferred embodiments of the present invention provides a viable alternative to conventional mixers and switching devices by providing for switching and/or mixing of electrical signals at higher frequencies as a result of channelizing majority carriers by a plurality of conductive finger gates into a series of lateral potential wells. A capacitive coupling of the conductive finger gates isolates the applied voltage within the series of lateral potential wells. Varying the voltage application to the finger gates manipulates the electrical signal flow from the signal input carrier 12 to the signal output carrier 20. As a result, an electrical signal can be switched and/or mixed, without the need for a balanced input, and with high voltage isolation. The RPWM is also a viable alternative to Gilbert Cell devices with significant advantages. For example, one RPWM can replace the two transistors in a Gilbert Cell, subsequently reducing cost. In addition, because the RPWM is a majority carrier device it can be operated under higher frequencies.

While the above description is of the preferred embodiment of the present invention, it should be appreciated that the invention may be modified, altered, or varied without deviating from the scope and fair meaning of the following claims. For example, the doping of the RPWM can be reversed so that holes become the majority carriers. Also, the low voltage could be manipulated to fully deplete the region under the corresponding conductive finger gates.

What is claimed is:

1. A semiconductor signal manipulating device comprising:
    a signal input carrier for inputting an applied electrical signal and comprising an input terminal in electrical communication with a input contact, the input contact being within a well region, the input contact and the well region being of a same conductivity type;
    a plurality of conductive fingers in electrical communication with the input contact; and
    signal manipulating means in electrical communication with the plurality of conductive fingers and the well region for manipulating the applied electrical signal upon being activated by application of an electrical manipulating signal to the plurality of conductive fingers.

2. The semiconductor signal manipulating device of claim 1, wherein the plurality of conductive fingers are comprised of polysilicon and are disposed over a gate oxide layer.

3. The semiconductor signal manipulating device of claim 1, wherein the signal manipulating means is for manipulating the applied electrical signal by applying a first electrical manipulating signal to a first set of the plurality of conductive fingers and a second electrical manipulating signal to a second set of the plurality of conductive fingers, the first set of the plurality of conductive fingers and the second set of the plurality of conductive fingers being arranged in an alternating configuration, and the second electrical manipulating signal being opposite in polarity to the first electrical signal.

4. The semiconductor signal manipulating device of claim 3, wherein the signal manipulating means is for creating a potential variance in the well region in which an electrical potential under the first set of the plurality of conductive fingers is shifted 180° in phase from the electrical potential under the second set of the plurality of conductive fingers.

5. The semiconductor signal manipulating device of claim 1, wherein the applied input electrical signal is channelized by the well region.

6. The semiconductor signal manipulating device of claim 1, wherein the input electrical signal is an RF current that is channelized by the well region.

7. The semiconductor signal manipulating device of claim 1, further comprising a signal output carrier comprising a plurality of output contacts, each of the plurality of output contacts being in electrical communication with a corresponding one of the plurality of conductive fingers, the plurality of output contacts further being located within a moderately doped region different in conductivity type than the plurality of output contacts and the well region.

8. The semiconductor signal manipulating device of claim 7, wherein the signal output carrier comprises a first terminal and a second terminal in electrical communication with the plurality of output contacts, the first terminal being in electrical communication with a first set of the plurality of conductive fingers and the second terminal being in electrical communication with a second set of the plurality of conductive fingers.

9. The semiconductor signal manipulating device of claim 1, wherein the applied electrical signal is time varied.

10. The semiconductor signal manipulating device of claim 1, wherein the signal manipulating means further comprises first and second terminals in parallel with one another, the first terminal for applying a first electrical signal and the second terminal for applying a second electrical signal, the first and second electrical signals for creating a capacitive variance within the well region.

11. The semiconductor signal manipulating device of claim 1, wherein the heavily doped input contact and the well region are of N-type conductivity.

* * * * *